United States Patent [19]

Takahashi

[11] Patent Number: 4,503,335
[45] Date of Patent: Mar. 5, 1985

[54] SEMICONDUCTOR PRINTING APPARATUS WITH MULTIPLE INDEPENDENT TEMPERATURE CONTROL

[75] Inventor: Kazuo Takahashi, Tokyo, Japan

[73] Assignee: Canon Kabushiki Kaisha, Tokyo, Japan

[21] Appl. No.: 366,070

[22] Filed: Apr. 6, 1982

[30] Foreign Application Priority Data

Apr. 13, 1981 [JP] Japan .................................. 56-55199

[51] Int. Cl.³ .............................................. G01N 21/86
[52] U.S. Cl. ................................. 250/548; 324/158 F;
355/30
[58] Field of Search .................... 432/35, 45; 236/1 R,
236/DIG. 15; 364/477; 72/128; 250/548, 200;
355/132, 144, 30; 324/158 F

[56] References Cited

U.S. PATENT DOCUMENTS 3,937,579  2/1976  Schmidt .............................. 355/132
3,963,985  6/1976  Geldermans ..................... 324/158 F
4,202,623  5/1980  Watkin ................................. 355/30

Primary Examiner—David C. Nelms
Assistant Examiner—J. Jon Brophy
Attorney, Agent, or Firm—Fitzpatrick, Cella, Harper & Scinto

[57] ABSTRACT

A semiconductor printing apparatus eliminates the alignment error caused by any relative deformation between the mask and the wafer due to variations in parameters such as temperature change, and intermediate processing, for example, etching etc. The apparatus is characterized by the provision of a device for cooling or heating respectively and independently plural different sections of at least either of the mask and the wafer.

9 Claims, 11 Drawing Figures (PRIOR ART) FIG. 1A
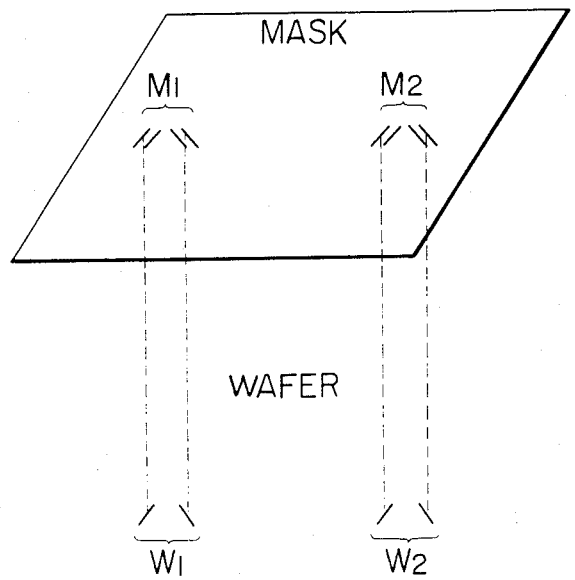
FIG. 1B
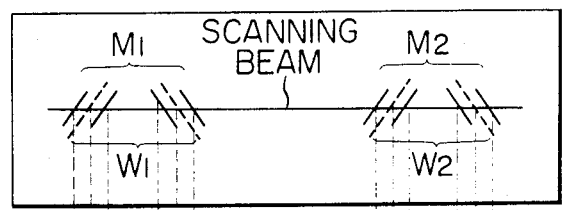
FIG. 1C
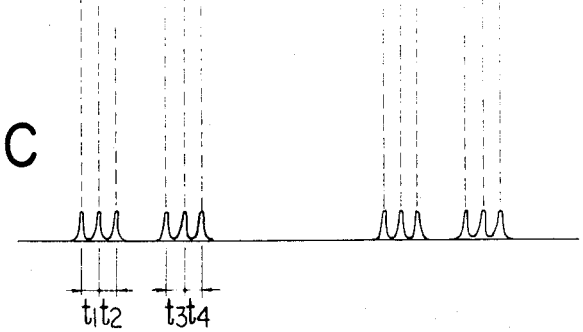

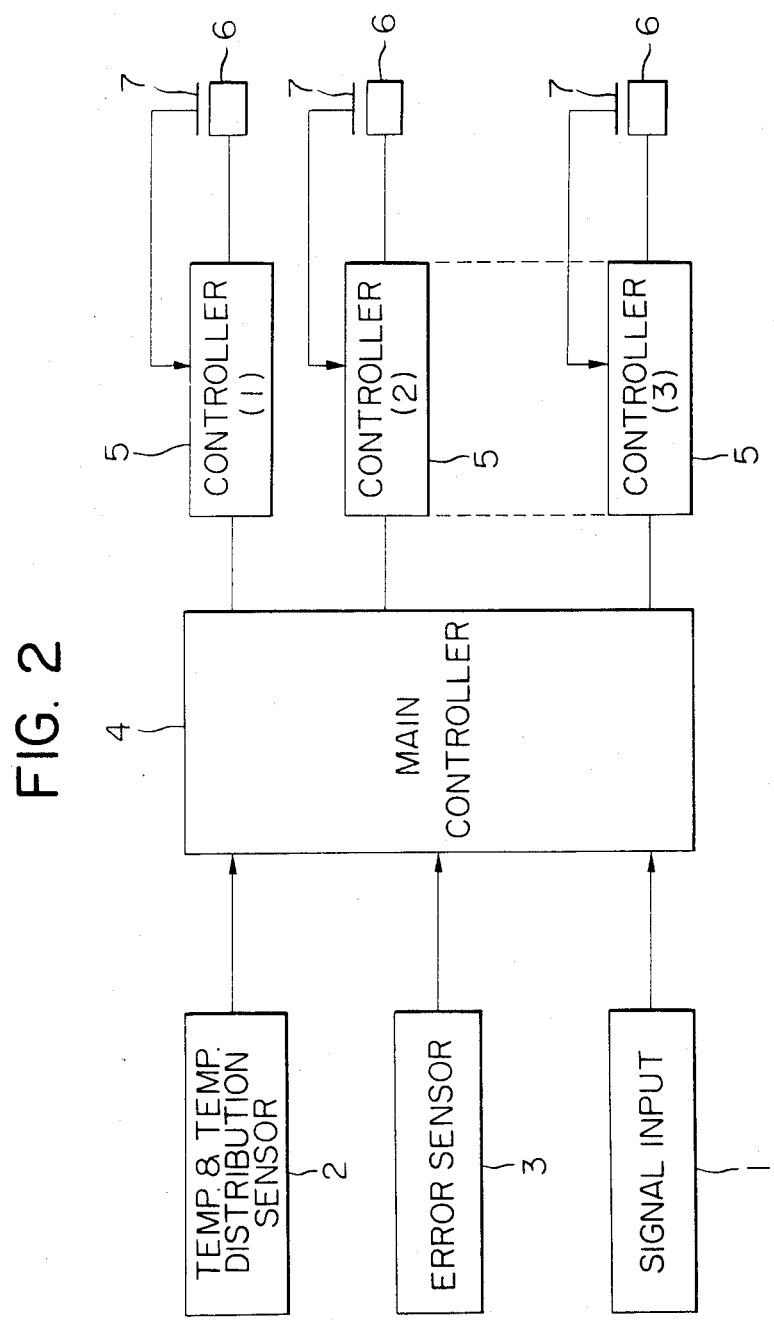

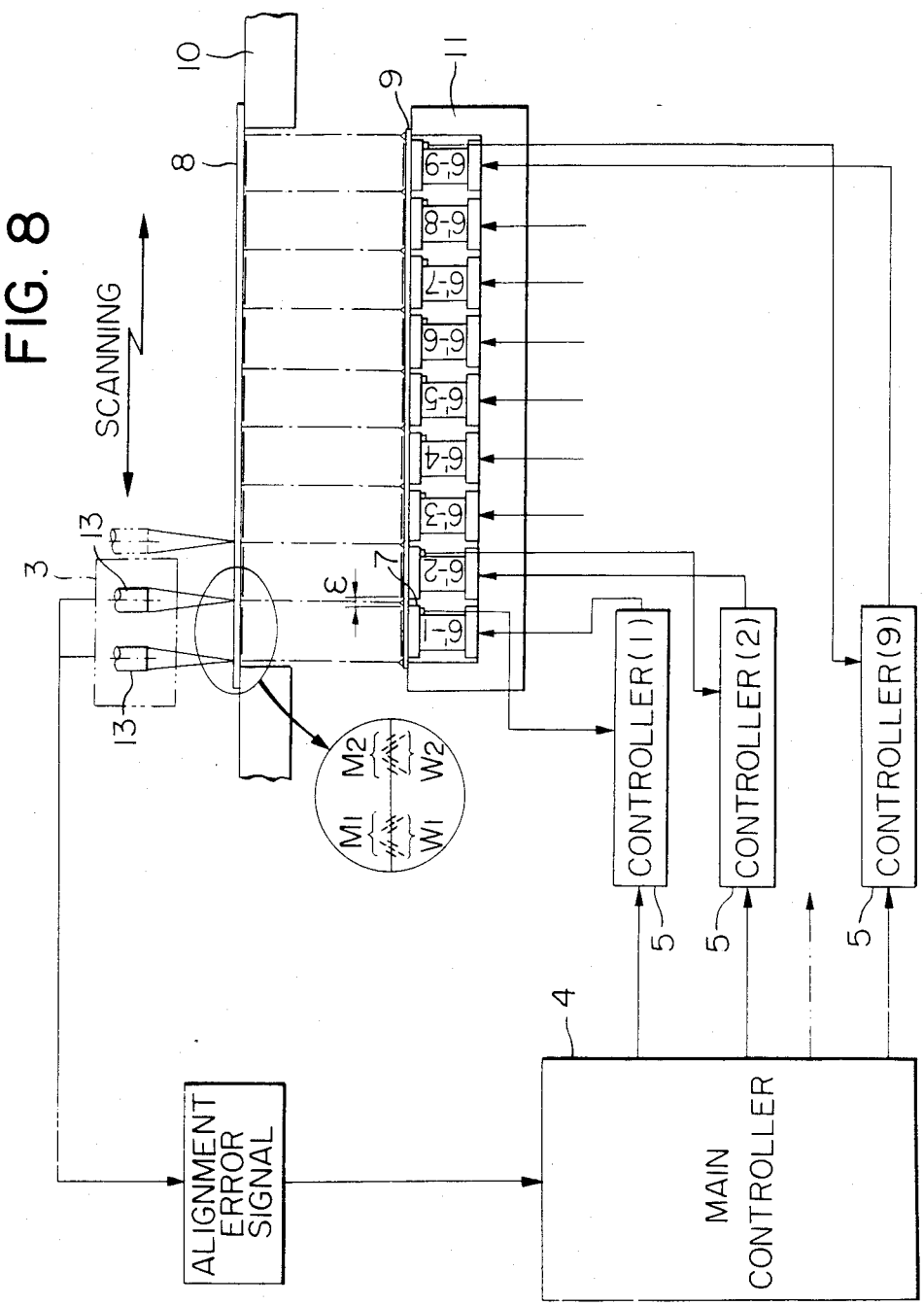

SEMICONDUCTOR PRINTING APPARATUS WITH MULTIPLE INDEPENDENT TEMPERATURE CONTROL

BACKGROUND OF THE INVENTION

1. Field of the Invention

The present invention relates to a semiconductor printing apparatus, that is, apparatus for transferring a pattern of a photo mask onto a wafer in the manufacturing process of semiconductors.

2. Description of the Prior Art

In the process for manufacturing semiconductors, in general, many repeated times of mask processing are required. During these processings, the temperature condition may vary from time to time. Also, characteristics of the transfer optical system may vary. Under these conditions, the photo mask and wafer have some difference in elongation or they are subjected to some relative deformation. Further, the aligned relation between mask and wafer is affected by intermediate processings such as etching. All of these variations of parameters together cause some deviation of the pattern.

If exposure is carried out with such deviated pattern, then it is no longer possible to make regular semiconductors. Therefore it is necessary to prevent or compensate for the algnment error of the pattern between the mask and wafer despite such parameter variation.

As a solution to the above problem, such apparatus has been known in which temperature-controlled air is blown against the mask or wafer (cf. U.S. Pat. No. 4,202,623 and Japanese Utility Patent Application laid open No. 17,951/1981). The blow air is pre-controlled to a constant temperature intending to keep constant the temperature of the mask or wafer or the temperature difference between mask and wafer. However, it is impossible to control the temperature of plural different sections respectively and independently by means of fluid although it may be possible to control the temperature difference as a whole. At present, the pattern used in printing semiconductors is highly miniaturized. Individual alignment of plural different sections can not be attained by the total temperature control by use of fluid as mentioned above.

Japanese Utility Patent Application laid open No. 88,238/1980 has disclosed the use of a plural number of air nozzles in the above-mentioned type of apparatus. However, this means a mere division of blown air by plural nozzles. It is by no means possible to control the temperature of plural different sections individually and independently according to the prior art.

Generally, temperature control by means of fluid involves the following problems:

First, as the heat capacity of a mask and a wafer is larger than that of air, a relatively long time is required to adjust the temperature of the mask or wafer to a determined constant level. Second, the temperature control by blowing air can not follow such a rapid change of temperature of the mask or wafer as is caused by a disturbance. Third, although the blown air itself is an air-controlled clean gas, there is a possibility that dust and foreign particles may be caught in the stream of blown air by convection of the blown air. Last, the refractive index of the air in the optical path may be varied from time to time by any disturbance caused by the air blown, which in turn may cause fluctuation of the projected optical image.

For the reasons mentioned above it is objectable to use the prior art technique in alignment of a miniature pattern.

SUMMARY OF THE INVENTION

Accordingly, it is an object of the present invention to provide a semiconductor printing apparatus with which the problem of error in pattern alignment between a mask and a wafer generally caused by the variation of parameters can be eliminated locally and further totally through local correction of the alignment error.

According to the invention the above object is attained by detecting the occurring alignment error and compensating for the error. If the alignment error is a constant proper to the system, the detection is unnecessary.

To detect the alignment error there may be used various detection means. For example, it may be attained by detecting the difference in temperature distribution between the mask and wafer. Also, it may be attained by detecting any relative deviation between the mask and wafer by employing a suitable alignment error measuring system such as a microscope.

Means for compensating for the detected alignment error constitutes an essential part of the invention. According to the invention said compensation means comprises means for heating or cooling at least either one of the mask and the wafer but plural different sections thereof respectively and independently.

Other and further objects, features and advantages of the invention will appear more fully from the following description of the preferred embodiments taken in connection with the accompanying drawings.

BRIEF DESCRIPTION OF THE DRAWINGS

FIGS. 1A, 1B and 1C are schematic illustrations of the conventional alignment between a mask and a wafer;

FIG. 2 illustrates the conception of a section-divided temperature control system according to the present invention;

FIG. 8 shows a further embodiment of the invention wherein an alignment error measuring system is used.

DESCRIPTION OF THE PREFERRED EMBODIMENTS

Figure 3:
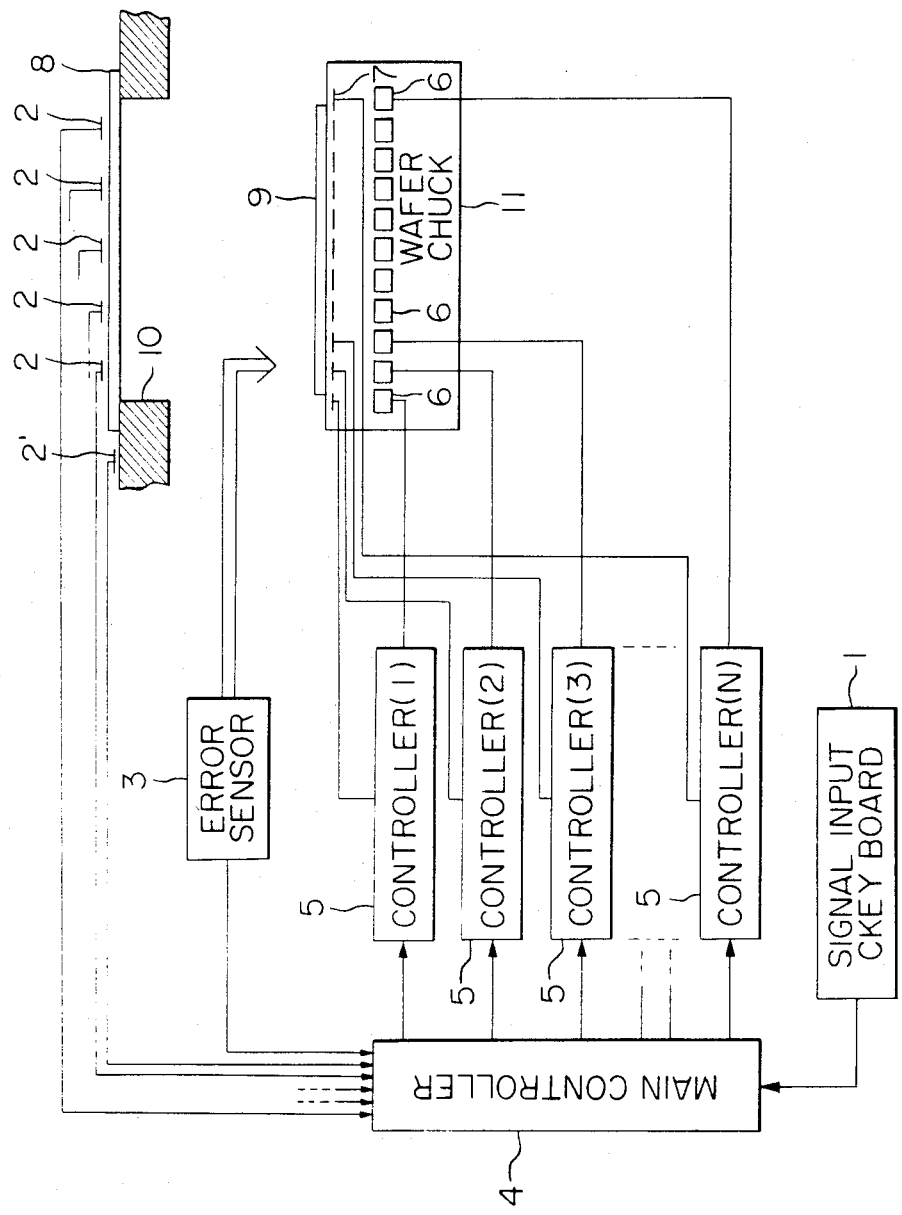
FIG. 3 shows an embodiment of the present invention.

At first, the manner of alignment between a wafer and mask according to the prior art will be described with reference to FIGS. 1A to 1C.

In FIG. 1A, M1 and M2 are alignment patterns marked on a mask and W1 and W2 are alignment patterns on a corresponding wafer. Each of the alignment patterns M1 and M2 on the mask is printed as a pair of duplex lines intersecting each other at right angles. The alignment patterns W1 and W2 on the wafer correspond to the alignment patterns M1 and M2 in position and form with the exception that each of the alignment patterns W1 and W2 is printed as a pair of singlet lines.

These alignment patterns are scanned, for example, by a scanning beam as shown in FIG. 1B. During the scanning there are produced from a photo-electric alignment detecting system edge signals in time series derived from the printed lines of the alignment patterns on the mask and wafer as shown in FIG. 1C. When the alignment patterns W1 and W2 are viewed as inserted into the corresponding alignment patterns M1 and M2 and are positioned in just the respective middles of M1 and M2, the alignment of the wafer with the mask is completed. Therefore, any alignment error can be detected as the difference in time between two intervals $t_1$ and $t_2$ or $t_3$ and $t_4$ (FIG. 1C).

Although the alignment patterns M1 and M2 have been shown to be spaced from each other in FIG. 1A for the sake of simple illustration, it is to be understood that the patterns may be arranged close to each other. Further, it is possible to embed such alignment patterns in a real element pattern at adjacent positions. As will be described later, sensors such as temperature sensors also may be embedded there.

The above alignment procedure must be repeated at each time of mask processing. The reason for this is that the conditions such as temperature under which one mask processing is carried out are generally different from that under which the next mask processing is carried out. If no alignment is conducted for the next mask processing after the alignment for the previous one, then there will be produced some deviation of the pattern, which hinders the manufacture of semiconductors.

Now, an embodiment of the invention will be described with reference to FIGS. 2 and 3.

Designated by 1 is a signal input unit for setting control parameters. The signal input unit may be, for example, a keyboard of teletypewriter. 2 is a sensor for detecting the temperature and the temperature distribution of mask. 3 is an alignment error measuring unit for detecting any deviation of the pattern. (This unit 3 may be omitted if there is available such signal from any alignment error detector originally attached to the printing apparatus such as photo-electric alignment detecting system). 4 is a main controller including a comparator, an arithmetic unit, a memory for storing information etc. (The main controller 4 may be a microcomputer). Designated by 5 are controllers for controlling heaters or semiconductor thermo-modules in response to the signal from the main controller 4. 6 depicts heating or cooling elements each formed of heater or semiconductor thermo-module. 7 depicts sensors disposed to detect the surface temperature of the wafer or the wafer chuck in the sections corresponding to the elements 6. The sensors 7 send the corresponding control signals to the respective controllers 5. 8 is a photo mask and 9 is a wafer. 10 is a mask holder for holding the photo mask and 11 is a wafer chuck for holding the wafer.

Figure 5:
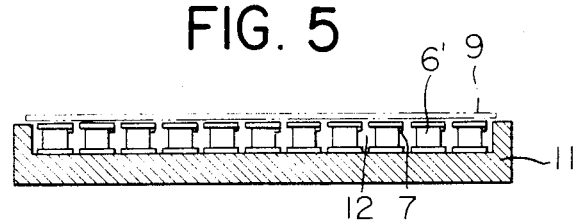
FIG. 5 is a longitudinal cross-section thereof.

The temperature sensors 2 on the mask side may be provided, for instance, in any small space between the real element pattern on the mask (for example, in the line area for scribing). On the other hand, the temperature sensors 7 on the wafer side may be embedded between the heating or cooling elements 6 as shown in FIG. 5. The sensors arranged in this manner do not interfere with exposure and therefore the state of exposure to light can be maintained.

The mounting position of the temperature sensors is never limited to only that described above. They may be mounted in the vicinity of non-exposure areas outside of the exposure area although the accuracy of temperature detection may be somewhat reduced thereby. But, in this case also the alignment can be carried out while maintaining the desired state of exosure because the sensors do not interfere with the exposure area. If there is no need of worrying about influence on the state of exposure, then temperature sensors may be arranged directly above the mask and directly above the wafer. The temperature sensors 7 on the wafer side may be arranged in such manner that they correspond to the sensors 2 on the mask side in one-to-one relation or in the relation that each one of the sensors 7 corresponds to each two or more of the sensors 2. The number of the temperature sensors 7 on the wafer side should be equal to the number of heating or cooling elements 6 arranged also on the wafer side. When the temperature sensors 7 on the wafer side are arranged in the latter mentioned relation of each one of the sensors 7 corresponding to each two or more of the sensors 2 on the mask side, the temperature of every section of the wafer is so controlled as to correspond to the average temperature in the corresponding plural sections of the mask.

In an embodiment later described, the deviation of pattern on the mask and wafer is detected at the same time by the alignment error measuring unit. In this case, alignment patterns are used as a reference. Like the above temperature sensors, the alignment patterns may be provided between the real element pattern on the mask. On the side of the wafer, such alignment patterns on the wafer may be arranged with each one corresponding to each one of the alignment patterns on the mask or with each one corresponding to two or more of the latter.

In the embodiment shown in FIGS. 2 and 3, the heating or cooling elements 6 are arranged in the wafer chuck 11 so as to give a certain controlled temperature distribution to the wafer chuck 11. The wafer 9 is temperature-controlled indirectly through the wafer chuck 11. Of course, it is possible to arrange the heating or cooling elements 6 in such manner that the wafer 9 can be temperature-controlled directly by the elements 6. In the illustrated embodiment, the wafer chuck 11 performs two different functions at the same time, to hold the wafer and to control the temperature of the wafer.

The manner of operation of the above described embodiment is as follows:

At the start of operation of the aligner, the operator carries out input of control parameters for setting the necessary control parameters by the signal input unit 1 which may be typewriter or keyboard. The input control parameters are introduced into the main controller 4 which has a series of operation sequences preliminarily registered in the memory. In response to the now input control parameters from the signal input unit 1, the main controller 4 selects a most appropriate sequence to the input control parameters among the various sequences stored in the memory. And the main controller 4 executes the selected operation sequence. If desired, these operation sequences for various different control parameters can be read in the memory within the main controller automatically at the time of setting the parameters through a magnetic memory connected to the signal input unit 1. Also, it is possible to scribe such operation sequences in any non-volatile memory element (such as PROM, EPROM etc). Further, a display unit such as CRT terminal, a-light emitting diode or liquid crystal display and/or a recording unit such as a printer may be connected to the main controller 4 in order to check and/or record the operational data during operation.

Examples of the above mentioned operation sequences for various different control conditions are as follows:

Sequence (i)

The temperature distribution of the photo mask 8 held by the mask holder 10 is detected by a plural number of temperature distribution measuring sensors 2 arranged on the photo mask 8. Data of the detected temperature distribution are introduced into the main controller 4 which issues signals to the respective controllers 5 to make the temperature distribution on the surface of the wafer chuck 11 equal to the temperature distribution of the wafer detected by the sensors 2. In response to the signals from the main controller 4, therefore, the respective controllers 5 actuate the heating or cooling elements 6 (heater or semiconductor thermo-module) connected thereto according to the signals from the main controller 4. At the same time, the respective controllers 5 control the heating or cooling elements 6 so as to keep their temperatures at the levels corresponding to the signals applied from the main controller 4, with reference to the chuck surface temperature detecting sensors 7 arranged corresponding to the heating or cooling elements 6 connected to the respective controllers 5.

Sequence (ii)

In case that plural sensors 2 belong to one controller 5, the temperature distribution of mask 8 is detected by the sensors 2 and the detected data are introduced into the main controller 4. The main controller 4 carries out an arithmetic operation to find out a mean value of the detected data and applies to the controllers 5 signals to adjust the surface temperature of the chuck 11 in every section equal to the mean value. With reference to the sensors 7, the respective controllers 5 control the heating or cooling elements 6 whereby the respective surface temperatures of plural sections of the chuck 11 are controlled to the respective mean values of the temperature distributions of the corresponding sections of the mask 8. The mean value as used herein may be a simple arithmetical mean of the temperatures detected by plural sensors 2 provided for one heating or cooling element 6 or such arithmetic mean somewhat weighted considering the positions of coordinates of the sensors 2.

Sequence (iii)

This sequence is substantially the same as above (i). But, the surface temperature of the chuck 11 is controlled in such manner that the temperature difference between the different points on the chuck surface corresponding to the sensors 2 can be maintained constant.

Sequence (iv)

This sequence is substantially the same as above (ii). But, the surface temperature of the chuck 11 is controlled in such manner that the surface temperature can be adjusted to a level different, by a certain value, from the mean value of the temperature distribution of the sensors 2 calculated by the main controller 4.

Sequence (v)

Temperature on the mask holder 10 is detected by one, two, three or four sensors 2' arranged on the holder but in the non-exposure area. From the output signals of the sensors the main controller 4 calculates the mean value in the same manner as above (if only one sensor is provided, the averaging processing is unnecessary). The respective sections of the chuck 11 are controlled to adjust the surface temperature of each section to the corresponding mean value.

Sequence (vi)

In a manner similar to the above (v), the surface temperature of the chuck 11 in the respective sections is so controlled as to adjust it to a level different from the mean value by a certain value.

Sequence (vii)

Date of temperature distribution of the mask 8 corresponding to the temperature of sensors 2' are previously stored in the memory within the main controller 4. The main controller 4 calculates the mean temperature of sensors 2' in the same manner as in the above (v) and then the main controller reads out the previously registered temperature distribution of the mask 8 corresponding to the sensors 2' from the memory. The chuck 11 is controlled toward the same temperature distribution as that read out from the memory.

Sequence (viii)

This sequence is substantially the same as above (vii). But, the surface temperature of the chuck 11 is controlled in such manner that the temperature difference between the temperature distribution of the mask 8 read out from the memory and the chuck surface temperature is made constant in the respective positions of the chuck surface.

Sequence (ix)

The surface temperature of the chuck 11 in the respective sections is controlled toward the temperature or temperature distribution given by the main controller 4.

Sequence (x)

As shown in FIG. 8, an error signal is obtained from an error sensor 3. (Generally, the mask aligners now available are equipped with a photo-electric aignment pattern detection system operable through a microscope objective lens 13. This detection system can serve also as the error sensor 3. Therefore, when such photo-electric alignment pattern detection system is intended to be used also as the error sensor 3, it is no longer necessary to provide any separate error sensor 3). The error signal (which may be, for example, such signal informing of the fact that $t_1$ and $t_2$ or $t_3$ and $t_4$ as shown in FIG. 1C are not equal to each other) is introduced into the main controller 4 which converts it into elongation of wafer and then controls the surface temperature of the chuck 11 so as to reduce the error to zero or about zero. As the error sensor 3 there may be used also means for observing the alignment error with the naked eye through the alignment optical system. If a plural number of alignment patterns are provided in the plural sections with one pattern corresponding to one section, then error detection can be carried out moving the error sensor 3 along the mask.

Sequence (xi)

This sequence is substantially the same as above (x). But, for any local alignment error caused by local distortion of the wafer, temperature control is carried out by controlling only those heating or cooling elements 6 whih are located at the positions corresponding to the positions of the local distortion of the wafer. The heating or cooling elements 6 are controlled in such manner as to reduce the local alignment error to zero or about zero.

Among these various operation sequences any suitable one may be selected as required while switching over the sequence from one to another. Also, two or more different sequences may be used in combination.

Figure 4:
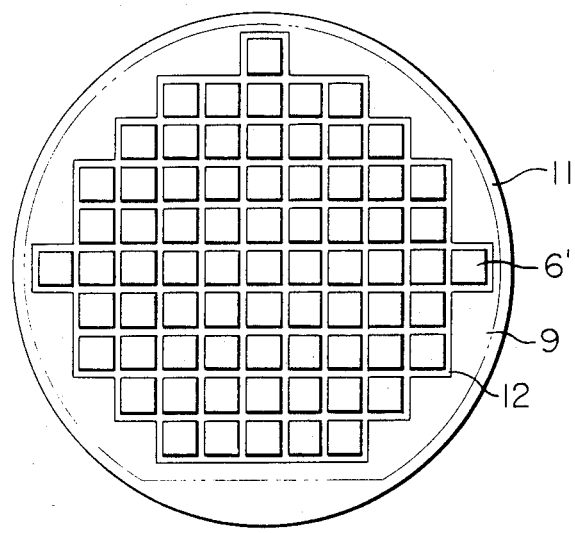
FIG. 4 shows another embodiment wherein semiconductor thermo-modules are used.

FIGS. 4 and 5 show another embodiment of the invention.

In this ambodiment, the surfaces of semiconductor thermo-modules 6' are used together as a wafer chuck surface. The gap 12 between the modules 6' in this embodiment can be used as a vacuum channel for holding the wafer on the chuck surface by suction force. As the thermo-modules are spaced from each other, there is almost no interaction between modules which is otherwise caused by heat transmission therebetween. The wafer is in direct contact with the surface of modules. These features of the embodiment bring forth also an advantage that local temperature control is easy to carry out. In this embodiment, like the above, temperature sensors 7 are arranged near the modules within the wafer chuck.

Figure 6:
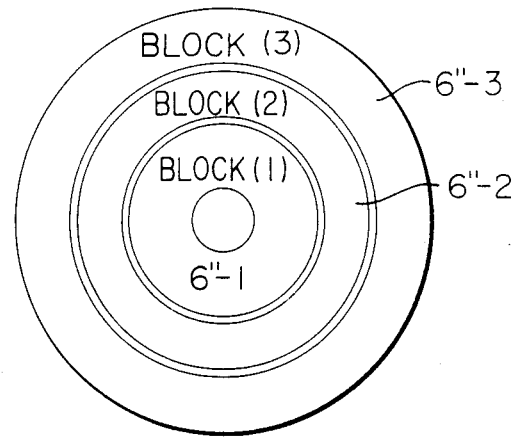
FIG. 6 shows an arrangement of concentrical ring block heaters.
Figure 7:
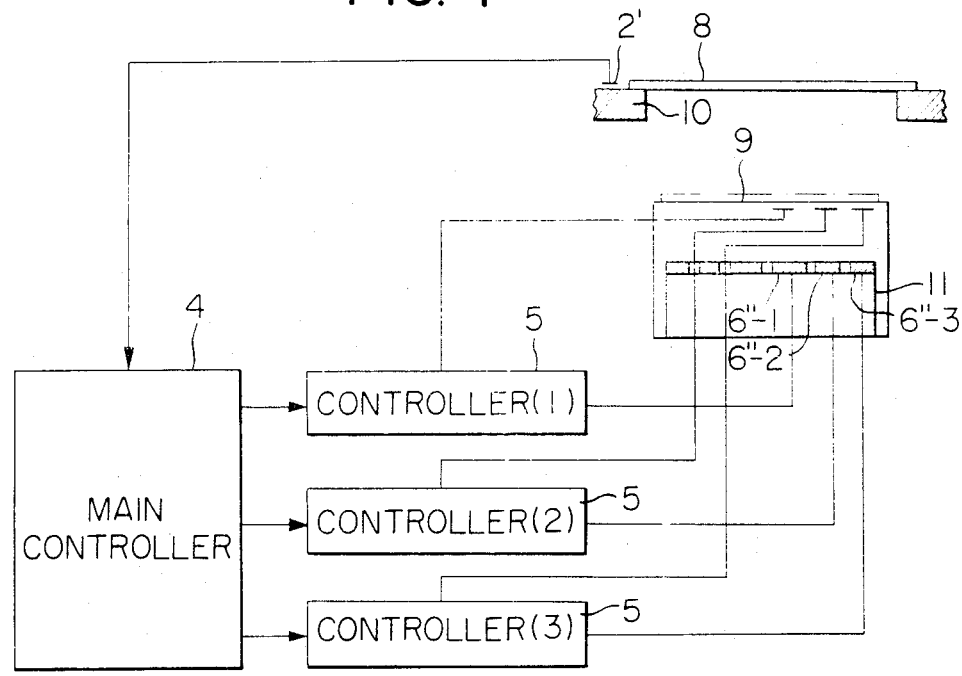
FIG. 7 shows an embodiment wherein the concentrical block heater arrangement is used.

FIGS. 6 and 7 show the simplest embodiment of the invention.

In this embodiment, block heaters of ceramic package are arranged in concentrical circles as shown in FIG. 6. With this arrangement the temperature control can be performed in a sufficiently stable manner by a very simple control system as shown in FIG. 7.

All of the above described embodiments are of the type with which all possible control parameters can be set and a most suitable control sequence for the set parameters can be executed. In mounting it on a printing apparatus, various modifications of the embodiments are possible. For example, the main controller 4 may be incorporated into the control computer used for controlling the printing apparatus. Also, in order to simplify the apparatus, the operation sequences as described above may be limited to one or two particularly determined sequences only. In the above embodiments, a plural number of heating or cooling elements 6 have been embedded in a chuck. However, when semiconductor thermo-modules are used as the heating or cooling elements 6 and the thermo-modules are arranged as shown in FIGS. 4 and 5, a chuck surface can be formed by the surfaces of the thermo-modules themselves. If the operational temperature of the apparatus is limited to the range above room temperature, there may be used, as the heating or cooling elements 6, simple heaters such as common metal wire, metal coating or semiconductor. The simplest embodiment of the heating or cooling elements 6 is that shown in FIGS. 6 and 7. Even when the simplest structure of the elements 6 is used, it is well possible to maintain the distribution of the chuck surface temperature within the range of ±0.1° C.

Figure 9:
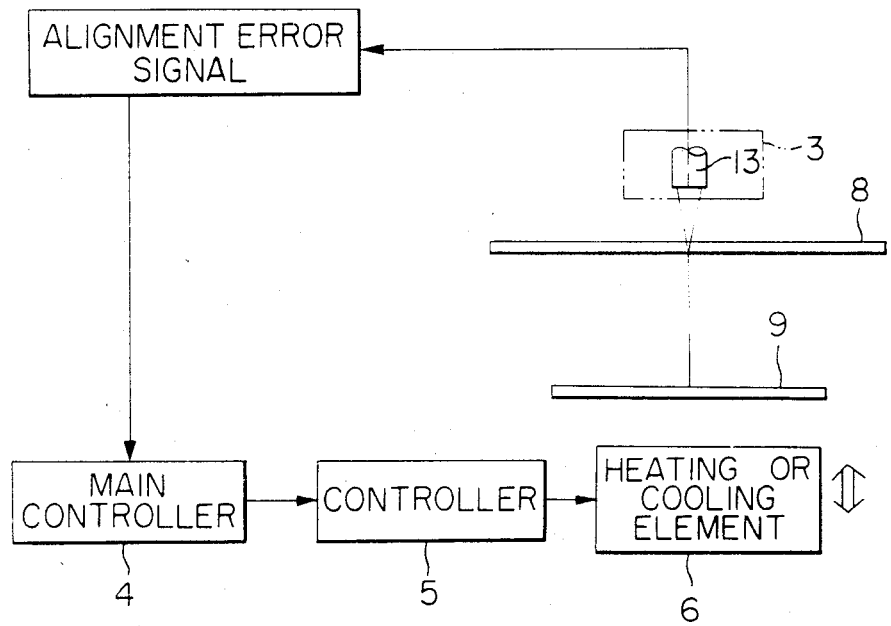
FIG. 9 shows still a further embodiment of the invention wherein the distance between heating/cooling means and the mask or wafer is changed.

FIG. 9 shows a further embodiment of the invention.

In this embodiment, the heating or cooling elements 6 may be moved relative to the wafer 9 as indicated by the arrow. Therefore, the temperature control is effected by changing the distance between wafer 9 and element 6. In this embodiment, heating/cooling means is not required to be variable in temperature but may be of constant temperature. All of heating or cooling means having a constant temperature can be used in this embodiment. Solid elements such as the above mentioned thermo-module are of course useful in this embodiment. Further, fluid jet devices such as air nozzles also may be used. By moving the heating or cooling element 6 two-dimensionally to and along the surface of the wafer 9 it is also made possible to control the temperature of the wafer section by section.

In the above, the present invention has been particularly shown and described with reference to the embodiments in which the temperature and the temperature distribution of individual objects are controlled to attain errorless alignment of two-dimensional miniature patterns. However, it is to be understood that the present invention is not limited to the described embodiments only. It should be apparent to those skilled in the art that the present invention is generally applicable to fine position alignment or pattern alignment between two objects one of which is a thermally expansile or contractile substance. Therefore, the present invention is never limited to use in semiconductor printing apparatus.

As readily understood from the foregoing, the present invention uses a section-divided temperature control system that enables selection at will the most suitable operation sequence for the purpose of control. In summary, the present invention has the following effects and advantages:

(1) Alignment error caused by the difference in thermal expansion between a photo mask and a wafer can be eliminated;

(2) Alignment error caused by non-linear elongation due to temperature distribution can be reduced because a temperature distribution analogous to that of the photo mask is given to the wafer according to the invention.

(3) The temperature and temperature distribution of a wafer chuck can be controlled externally. Therefore, the apparatus of the invention is useful also for alignment of such a pattern which has been printed in another printer or under another temperature condition.

(4) The local temperature control according to the invention is effective to decrease such pattern alignment error caused by any local distortion of a wafer as produced at printing step or at any other step of semiconductor manufacturing process. (Decrease of the alignment error generally is called in-plane distortion).

(5) Stability of the apparatus can be improved. Any printing apparatus can not get in a stable state at once after starting. The temperature of the apparatus itself gradually increases under heat generation from it after the start of operation. It generally takes several hours until the apparatus gets in a stable state of operation. Therefore, strictly speaking, the pattern printed immediately after the start of operation is different from that printed in the stable state of operation because of some difference in temperature between the two printing points in time. To overcome the problem, it is required to provide means for keeping the apparatus always in a stable state. According to the invention, the temperature of wafer chuck can forceably be controlled to a constant temperature with reference to the temperature of the photo mask. Thus, the present invention overcomes the problem and improves the stability of the apparatus.

What I claim is:

1. A semiconductor printing apparatus capable of compensating for any relative local variation in size between a mask and a wafer in the planes of the mask and the wafer, said printing apparatus comprising:
   means for holding a mask;
   means for holding a wafer; and
   means for locally adjusting the temperature of at least one of the mask and the wafer thereby compensating for the local variation in size in the planes of the mask and the wafer between the mask and wafer.

2. A semiconductor printing apparatus as set forth in claim 1, wherein said temperature adjusting means comprises plural solid elements independently controllably disposed along the surface of at least one of the mask and the wafer.

3. A semiconductor printing apparatus as set forth in claim 2, wherein said means for holding a wafer comprises a wafer chuck and wherein said temperature adjusting means is provided in said wafer chuck.

4. A semiconductor printing apparatus as set forth in claim 2, wherein said temperature adjusting means comprises plural thermo-modules independently controllably disposed along the surface of at least one of the mask and wafer.

5. A semiconductor printing apparatus as set forth in claim 4, wherein the surfaces of said thermo-modules together form a wafer holding surface and the gap between said thermo-modules is used as a vacuum channel for holding said wafer by suction.

6. A semiconductor printing apparatus as set forth in claim 1, wherein said temperature adjusting means is movable to change the distance therebetween and at least one of the mask and wafer.

7. A semiconductor printing apparatus capable of compensating for any local variation in size between a mask and a wafer in the planes of the mask and the wafer, said printing apparatus comprising:
   means for detecting the temperature in a local area of at least one of the mask and the wafer;
   means for locally adjusting the temperature of at least one of the mask and the wafer thereby to compensate for the local variation in size of at least one of the mask and the wafer in the planes of the mask and the wafer; and
   means for controlling said temperature adjusting means according to the difference in temperature distribution between the mask and the wafer detected by said temperature detection means.

8. A semiconductor printing apparatus as set forth in claim 7, further comprising a wafer chuck for holding the wafer and wherein said temperature detection means detects the temperature of the wafer and is provided within said wafer chuck.

9. A semiconductor printing apparatus as set forth in claim 7, wherein said temperature detection means detects the temperature of the mask and is provided in the space of a mask pattern.

* * * * *

UNITED STATES PATENT AND TRADEMARK OFFICE
CERTIFICATE OF CORRECTION

PATENT NO. : 4,503,335

DATED : March 5, 1985

INVENTOR(S) : KAZUO TAKAHASHI

It is certified that error appears in the above-identified patent and that said Letters Patent is hereby corrected as shown below:

Column 1

Line 28, change "algnment" to --alignment--.

Line 58, after "Second," delete --the--.

Column 3

Line 3, change "singlet" to --single--.

Column 4

Line 7, change "exosure" to --exposure--.

Column 6

Line 25, change "previusly" to --previously--.

UNITED STATES PATENT AND TRADEMARK OFFICE
CERTIFICATE OF CORRECTION

PATENT NO. : 4,503,335

DATED : March 5, 1985

INVENTOR(S) : KAZUO TAKAHASHI

It is certified that error appears in the above-identified patent and that said Letters Patent is hereby corrected as shown below:

Column 7

Line 18, change "ambodiment" to --embodiment--.

Signed and Sealed this

Eighth Day of April 1986

[SEAL]

Attest:

DONALD J. QUIGG

Attesting Officer

Commissioner of Patents and Trademarks